(12) United States Patent
Wilson

(10) Patent No.: US 10,503,603 B2
(45) Date of Patent: Dec. 10, 2019

(54) INCREMENTAL DATA CONVERSION USING A SYNCHRONIZATION INFORMATION RECORD

(71) Applicant: Bentley Systems, Incorporated, Exton, PA (US)

(72) Inventor: Samuel W. Wilson, Downingtown, PA (US)

(73) Assignee: Bentley Systems, Incorporated, Exton, PA (US)

( * ) Notice: Subject to any disclaimer, the term of this patent is extended or adjusted under 35 U.S.C. 154(b) by 459 days.

(21) Appl. No.: 15/080,888

(22) Filed: Mar. 25, 2016

(65) Prior Publication Data

US 2017/0277592 A1    Sep. 28, 2017

(51) Int. Cl.
| | |
|---|---|
| *G06F 17/30* | (2006.01) |
| *G06F 11/14* | (2006.01) |
| *G06F 16/23* | (2019.01) |
| *G06F 16/25* | (2019.01) |
| *G06F 16/27* | (2019.01) |
| *G06F 17/50* | (2006.01) |

(52) U.S. Cl.
CPC .......... *G06F 11/1451* (2013.01); *G06F 16/23* (2019.01); *G06F 16/258* (2019.01); *G06F 16/275* (2019.01); *G06F 17/50* (2013.01); *G06F 2201/80* (2013.01)

(58) Field of Classification Search
CPC .................................................. G06F 11/1451
USPC ....................................................... 707/625
See application file for complete search history.

(56) References Cited

U.S. PATENT DOCUMENTS

| | | |
|---|---|---|
| 6,202,085 B1 | 3/2001 | Benson et al. |
| 6,341,291 B1 | 1/2002 | Bentley et al. |
| 6,671,701 B1 | 12/2003 | Chouinard |
| 6,795,868 B1 | 9/2004 | Dingman et al. |

(Continued)

OTHER PUBLICATIONS

"Introduction to Microsoft Sync Framework," Microsoft Sync Framework Developer Center, Microsoft Corporation, <https://msdn.microsoft.com/en-us/sync/bb821992>, Oct. 2009, pp. 1-8.

(Continued)

*Primary Examiner* — Hicham Skhoun
(74) *Attorney, Agent, or Firm* — Cesari and McKenna, LLP; James A. Blanchette

(57) ABSTRACT

In one embodiment, techniques are provided for converting data items of a source repository that maintains a CAD description according to a first storage format to data items of an output repository that maintains the CAD description according to a second storage format. A converter gathers data items of the source repository and compares current condition information for them with condition information as of a last successful conversion maintained by a synchronization information record separate from the source repository. The converter determines one or more new or changed data items in the source repository since the last successful conversion, converts new or changed data items to the second storage format of the output repository, and stores them in the output repository, while skipping any unchanged data items. The converter further updates the synchronization information record to include the current condition information for data items in the source repository.

20 Claims, 6 Drawing Sheets

(56) References Cited

U.S. PATENT DOCUMENTS

| | | | |
|---|---|---|---|
| 7,107,280 B2 | 9/2006 | Tomic et al. | |
| 7,194,489 B2 | 3/2007 | Bentley et al. | |
| 8,001,552 B1 | 8/2011 | Chickneas | |
| 8,155,943 B2 | 4/2012 | Nasle | |
| 8,190,648 B1 | 5/2012 | Tomic et al. | |
| 2002/0144239 A1* | 10/2002 | Bentley | G06F 17/30569 717/136 |
| 2003/0135339 A1* | 7/2003 | Gristina | G01D 4/004 702/61 |
| 2003/0172168 A1 | 9/2003 | Mak et al. | |
| 2009/0319454 A1* | 12/2009 | Regli | G06N 20/00 706/13 |

OTHER PUBLICATIONS

U.S. Appl. No. 14/928,614, filed Oct. 30, 2015 by Keith A. Bentley for a Techniques for Application Undo and Redo Using SQL Patchsets or Changesets, pp. 1-40.

"Notification of Transmittal of the International Search Report and the Written Opinion of the International Searching Authority, or the Declaration," International Filing Date: Nov. 3, 2016, International Application No. PCT/US2016/060325, Applicant: Bentley Systems, Incorporated, dated Feb. 23, 2017, pp. 1-18.

* cited by examiner

INCREMENTAL DATA CONVERSION USING A SYNCHRONIZATION INFORMATION RECORD

BACKGROUND

Technical Field

The present disclosure relates generally to computer aided design (CAD), and more specifically to techniques for converting CAD descriptions among data formats.

Background Information

Computer aided design (CAD) applications typically maintain CAD descriptions of physical structures (e.g., buildings, civil infrastructure projects, etc.) using data item arranged according to a storage format. One type of storage format (referred to herein as a "file-based storage format") involves one or more files (e.g., a root file and one or more attached files) that maintain a series of data structures that represent elements organized into models, associated with levels that help define graphical views. In such a storage format, elements generally describe individual units of the structure. For example, in a simple CAD description of a building, elements may represent walls, doors, windows, furniture, etc. Models generally group together related elements into larger units, effectively "owning" a set of elements. A CAD description consists of at least one model (e.g., a root model), and often a number of additional models (e.g., attached models) organized under the root model using attachments to form a model graph. For example, in a simple CAD description of a building, a root model may represent an overall building, and may reference, via attachments, attached models that represent individual floors, each attached model owning elements representing walls, doors, windows, furniture, etc. disposed on a respective floor. A level generally describes selected elements that should be displayed (e.g., "turned on") and, in some cases, symbology (e.g., color, line weight, line style etc.) that controls their visual appearance. For example, in a simple CAD description of a building, a level may include all the elements that represent windows, and indicate that such elements should be displayed with black, thin, dashed lines. Graphical views generally are representations of selected elements shown with certain symbology. For example, in a simple example CAD description of a building, a particular graphical view may show elements that represent walls and windows, with walls represented with black, bold, solid lines and windows represented in black, thin, dashed lines. Graphical views may be defined by attachment paths from a root model in the model graph, with the symbology and range of elements indicated by elements of the model graph, the levels to which the elements belong, and by attachment specific copies of levels ("attached levels") that override the display status and symbology of the levels. Such an arrangement may be better understood by reference to the example in FIG. 1

FIG. 1 is a data structure diagram 100 of a portion of an example first storage format (e.g., a file-based storage format) for a CAD description. The data structure diagram 100 may be consistent with the DgnV8 format, compatible with CAD applications available from Bentley Systems, Inc. of Exton, Pa. However, it should be understood that similar formats may be used in other CAD applications, available from other vendors. The data structure diagram 100 represents a number of data items, embodied using various data structures. In the data structure diagram 100, a file data structure 110 serves as a header of each file (e.g., a root file or attached file), and includes a name field that indicates a unique human readable name for the file, a models field that references model data structures contained in the file, and a levels field that references level data structures contained in the file. Each model data structure 120 represents an individual model (e.g., a root model or an attached model) and includes a model ID field that indicates a unique identifier for the model, a name field that indicates a unique human readable name for the model, a file field that references the owning file, and elements fields that reference element data structures owned by the model. Each model may be located in a spatial coordinate system used to define the arrangement of its elements. Each element data structure 130 represents an individual element owned by a model and includes an element ID field that indicates a unique identifier for the element within the file, a model ID field that indicates the owning model data structure, a level field that indicates a level associated with the element, a data field that includes information describing the unit of the physical structure being represented by the element, and a DHDR field that indicates an associated DHDR data structure. Each DHDR data structure 140 indicates range and symbology information that describes how the owning element should be rendered, including a color field, a weight field and a style field. Each element data structure may reference a level data structure 150 for a level to which it belongs. Each level data structure 150 represents a level to which elements may belong, including a level ID field that indicates a unique identifier for the level, a name field that indicates a unique human-readable name for the level, a display field that indicates whether elements on the level should be displayed (e.g., "turned on"), and symbology fields, such as a color field, a weight field and a style field, that indicate overrides to the symbology of individual elements of the level.

A model graph is defined using attachment data structures that defines the ownership structure of models and the presence of any attached levels. Each attachment data structure 160 includes a file name field that references the file containing the attached model, a model name field that references the attached model, a transform field that indicates any spatial transform that may be applied to relate a spatial coordinate systems used by the attached model to that of the owning model, and attached level fields that references attached levels that may be used with the attachment. Each attached level data structure 170 defines overrides for an underlying level, and includes a level ID field that identifies the attached level, a display field that indicates whether the level should be displayed, and symbology fields, such as a color field, a weight field and a style field, that may override the symbology of the level. A graphical view may be defined in the model graph by a view data structure 190 that references a particular model data structure 120 that serves as a root for attachment paths of the model graph of the view. A variety of other data structures and fields may also be included in the first storage format.

It may be desirable to convert data items of a CAD description of a first storage format (e.g., a file-based storage format), such as the format depicted in FIG. 1, to a second storage format. The data items of the first storage format may be stored in a first repository (referred to in the context of a conversion as a "source repository") and the data items of the second storage format may be stored in a second repository (referred to in the context of a conversion as an "output repository"). In some cases, repeated (e.g., periodic) conversions of data items between the first storage format of the source repository and the second storage format of the output repository may be necessary to maintain consistency, for example, where the CAD description in the source repository is periodically edited. In these cases, only a small portion of the data items in the source repository may have changed between consecutive conversions, and thereby performing a full conversion of all data items in the source repository may be highly inefficient. However, various technical challenges have hindered the development of effective incremental CAD description converters that are capable of detecting and processing only the data items that have changed.

Generally, little data items information is maintained indicating the provenance of each data item in the output repository. Determining which data item, or potentially data items, in the source repository yielded a data item in the output repository can be a complicated matter. There may not always be a 1:1 correspondence between in the source repository and data items in the output repository. Even if there is a 1:1 correspondence, the same globally unique identifier (ID) may not be utilized in both storage formats. Further, IDs may not be stable over time. For example, a source repository may reuse a same ID with a different data item at different times. All these issues hinder the use of conventional synchronization frameworks in implementing an incremental CAD description converter. Such frameworks generally place demands on the source repository and/or the output repository that cannot readily be met (for example, that the output repository keep a record of the provenance of every item in the output repository, or that the source repository itself provides an indication of every data item that has changed since a last conversion).

Accordingly, there is a need for improved techniques that may enable effective incremental CAD description conversion between data items of a source repository that uses a first storage format and data items of an output repository that uses a second storage format.

SUMMARY

An improved CAD description converter utilizes a special synchronization information record that maintains condition information as of a last successful conversion. The synchronization information record may enable incremental conversion even when the source repository has limited capabilities (e.g., that the source repository is simply able to enumerate its contents). Likewise, the synchronization information record may enable incremental storage format conversion even when the output repository has limited capabilities (e.g., the output repository itself does not keep a record of the provenance of its data items). The condition information stored in the synchronization information record may track 1:n correspondence between data item in the source repository and data items in the output repository, may track usage of different IDs for data elements in the source repository than for corresponding data items in the output repository, and may differentiate between data items even when the IDs used in the source repository are unstable.

In one specific embodiment, a converter utilizes the synchronization information record to convert from data items of a source repository that maintains a CAD description according to a first storage format (e.g., a file-based storage format, such as a DgnV8 format) to data items of an output repository that maintains the CAD description according to a second storage format (e.g., a relational database-based storage format, such as a DgnDb format). The converter gathers data items of the source repository, and compares current condition information for data items of the source repository with condition information as of a last successful conversion maintained by a synchronization information record separate from the source repository. The condition information of the synchronization information record includes at least identities of the data items of the source repository as of the last successful conversion, mappings of the data items of the source repository to corresponding data items of an output repository produced from conversion, and state of the data items of the source repository as of the last successful conversion. In response to the comparison, the converter determines one or more new, changed data or deleted items in the source repository since the last successful conversion, and converts new or changed data items to the second storage format to be stored in the output repository, or removes data items from the output repository corresponding to deleted data items, while skipping any unchanged data items of the source repository. The converter further updates the synchronization information record to include the current condition information for data items in the source repository.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
FIG. 1 is a data structure diagram of a portion of an example first storage format (e.g., a file-based storage format) for a CAD description.
Figure 2:
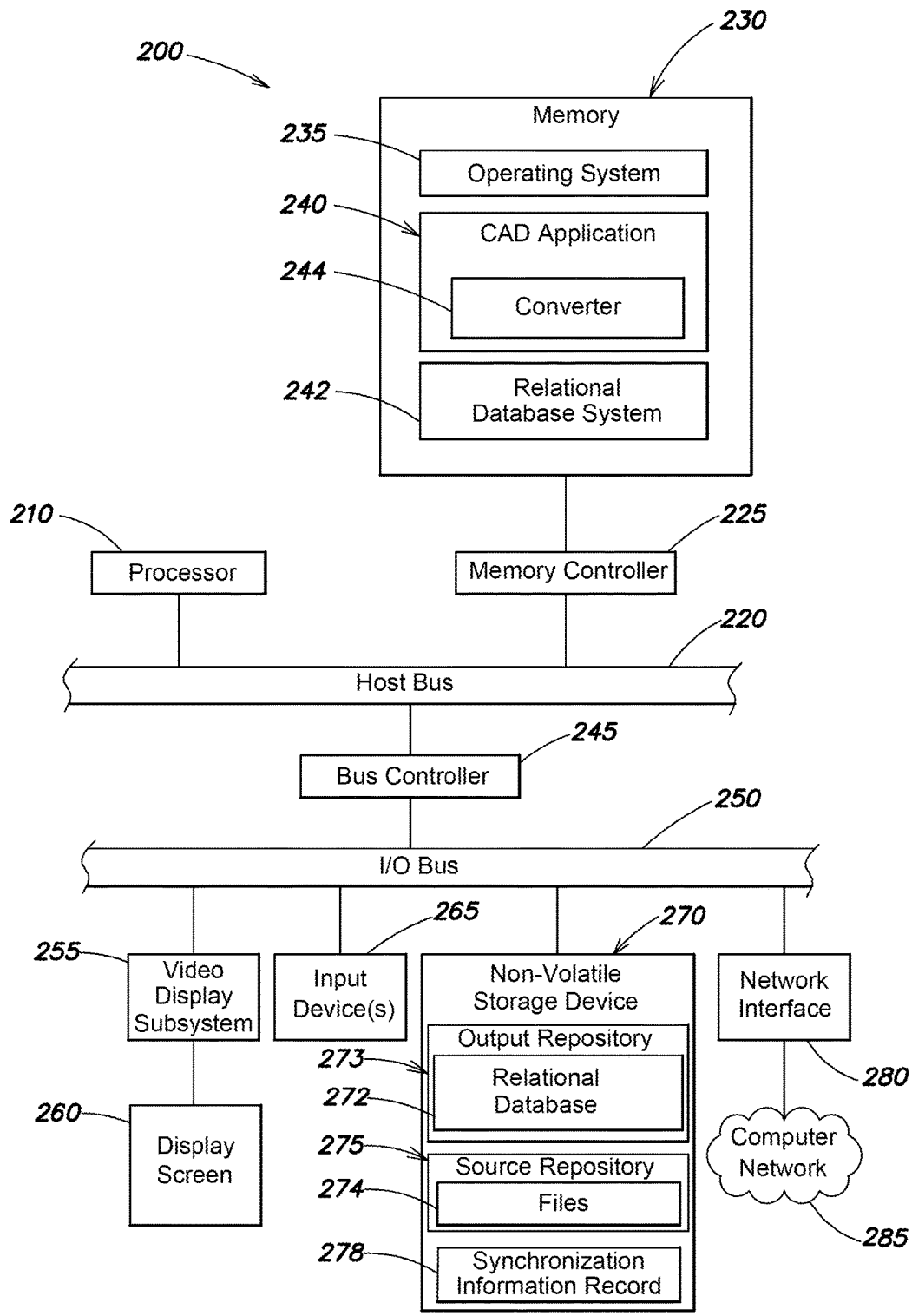
FIG. 2 is a block diagram of an example electronic device in which at least some of the presently described techniques may be employed.

FIG. 2 is a block diagram of an example electronic device 200 in which at least some of the presently described techniques may be employed. The electronic device may be designed for stationary operation (e.g., may be a desktop computer), or may be a portable electronic device (e.g., a notebook computer, a tablet computer, etc.) designed to be readily transported by a user and utilized from a variety of different locations. The electronic device 200 includes at least one processor 210 coupled to a host bus 220. A volatile memory 230, such as a random access memory (RAM), is coupled to the host bus 220 via a memory controller 225 and configured to store an in-memory copy of software and data. The in-memory copy of software and data may include an operating system 235, a CAD application 240, a relational database system 242, and a CAD description converter (e.g., capable of incremental conversion) 244, among other software, as well as an in-memory copy of CAD descriptions (not shown) used at least by the CAD application 240 and converter 244, and an in-memory copy of condition information (not shown) used at least by the converter 244, among other data. Such software and data is loaded into the volatile memory 230 when needed from persistent copies maintained on a non-volatile storage device 270 (e.g., a hard disk, a solid-state drive, etc.)

The host bus 220 of the electronic device 200 is coupled to an input/output (I/O) bus 250 through a bus controller 245. A video display subsystem 255 that includes a display screen 260 is coupled to the I/O bus 250. The display screen 260 may show a user interface of the CAD application 240 and/or the converter 244, as well as user interfaces of other software executed on the electronic device 200. One or more input devices 265 (e.g., a mouse, keyboard, touch sensor, etc.) are also coupled to the I/O bus 250. The input devices 265, among other uses, are used to interact with the CAD application 240 and/or the converter 244. The above-discussed non-volatile storage device 270, and a network interface 280, are further coupled to the I/O bus 250.

The network interface 280 may be coupled to a computer network 285 (e.g., the Internet) to allow for communication between the electronic device 200 and other electronic devices, using any of a number of well-known networking protocols, thereby enabling various distributed, collaborative or remote computing configurations. It should be understood that, according to such configurations, some, or all, of the software and data shown resident in memory 230 or stored in the non-volatile storage device 270 may be remotely located on another electronic device, and accessed via the computer network 285.

The non-volatile storage device 270, in addition to storing copies of the executable software, persistently stores copies of CAD descriptions used by the CAD application 240 and condition information used by the converter 244. Certain CAD descriptions may be stored in files 274 according to a first storage format (e.g., a file-based storage format). Other CAD descriptions may be stored in tables of a relational database 272 according to a second storage format (e.g., relational database-based storage format). The files of the second storage format (e.g., relational database-based storage format) may be directly loaded by the relational database system 242 into memory 230 and used by the CAD application 240, while the files 274 of the first storage format (e.g., the file-based storage format) may require conversion by the converter 244 before being directly usable by the CAD application 240 (but may be directly useable by other CAD applications (not shown) that natively utilize that storage format). From the perspective of the converter 244, the files 274 of the first storage format (e.g., the file-based storage format) may be considered part a "source repository" 275, and the relational database 272 may be considered part of an "output repository" 273. The condition information may be stored as part of a special synchronization information record 278 that is separate from the source repository 275 and/or the output repository 273.

In various implementations, the application 240, relational database system 242, converter 244, the files 274 of the source repository, the synchronization information record 278, and relational database 272 of the output repository, may take on various forms. In some specific implementations, the CAD application 240 is the i-Model Composition Server or the ProjectWise Conversion Server available from Bentley Systems, Inc. of Exton, Pa., the relational database system 242 is a SQL database system (e.g., the SQLite® database system available open source), the converter 244 is an embedded process of the CAD application 240, the files 274 may DgnV8 files that utilize a DgnV8 storage format, the synchronization information record 278, is a relational database and the relational database 272 may be a DgnDb database that utilizes the DgnDb format, which is compatible with CAD applications available from Bentley Systems, Inc. It should be understood, however that such specific software and formats are merely examples.

In a second storage format (e.g., a relational database-based storage format such as DgnDb), a CAD description describing a physical structure (e.g., a building, civil infrastructure project, etc.) may be represented by, e.g., a database including a number of tables consisting of columns and rows. The rows of various tables may represent elements organized into models and associated with categories and subcategories. In this context, an element may describe an individual unit of the structure, and store information that is intrinsic to that unit. Elements may have aspects that store information that can change through the lifecycle of the element, for example, an element geometry aspect that indicates placement and size of the element. A model may group together related elements into a larger unit, with elements being atomic. Models may use a single common spatial coordinate system (a "project coordinate system") to describe the physical positioning of elements, such that the representation is coherent spatially (e.g., as opposed to being formed from a collection of "fragments" that use differing spatial coordinate systems as with the example first storage format discussed above). A category may describe a type to which an element may belong. A category may have a number of subcategories that describe properties of aspects of elements that belongs to the category. For example, an element geometry aspect may contain geometric primitives on one or more subcategories that each define a symbology (e.g., color, line weight, line style, etc.) to be used in displaying the element. A graphical view may be defined by specifying models and categories that are displayed (e.g., are "turned on"), and overrides to the default symbology of subcategories of the displayed categories.

Figure 3:
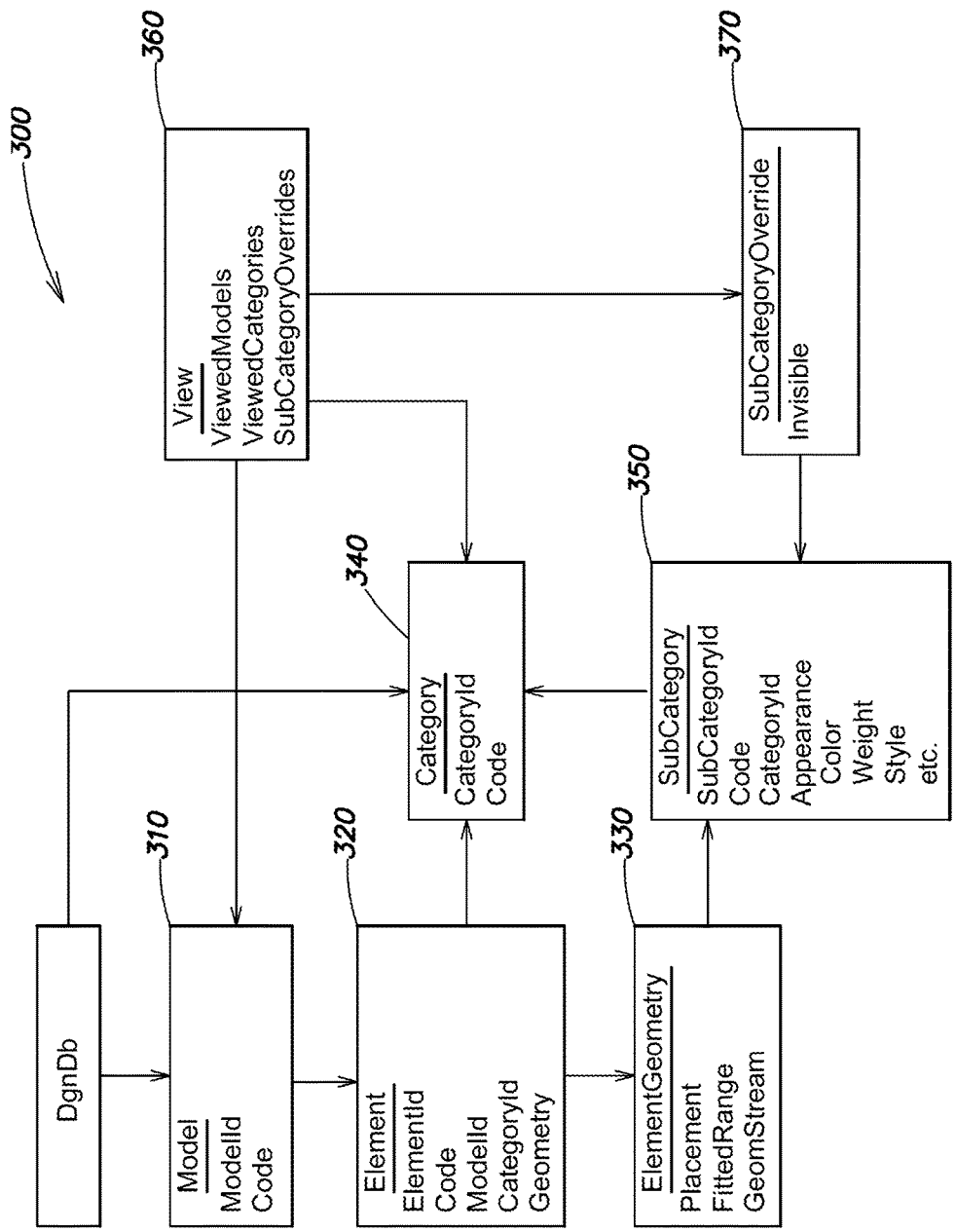
FIG. 3 is a schema of a portion of an example second storage format (e.g., a relational database-based storage format) for a CAD description that may be stored in an output repository after conversion.

FIG. 3 is a schema 300 of a portion of an example second storage format (e.g., a relational database-based storage format) for a CAD description that may be stored in an output repository after conversion. The schema 300 may represent a portion of a DgnDb format compatible with CAD applications available from Bentley Systems, Inc. However, it should be understood that similar structures may be employed in other storage formats.

In the schema 300, rows of a model table 310 represent models. Model table columns may include a model ID column that indicates a unique local identifier for the model and a code column that indicates a unique human readable name for the model. An element table 320 may include rows that represent elements. Element table columns may include an element ID column that indicates a unique identifier for the element, a code column that indicates a unique human readable name for the element, a model ID column that indicates the owning model (e.g., referencing the row of the model table 310), a category ID column that indicates a category associated with the element (e.g., referencing a row of the category table 340, such that one element may belong to one category), and a geometry column that indicates a geometry aspect for the element (e.g., referencing a row of an element geometry table 330).

Rows of the element geometry table 330 may represent geometry aspects of the referencing element. Columns of the element geometry table 330 may include placement columns that indicates a location and orientation of the element, a size columns that indicates a spatial size of the element, and a geometry stream column that holds geometric primitives that reverence one or more subcategories. Element geometry table rows may reference one or more rows of a subcategory table 350, such that one or more element geometries may reference one or more subcategories.

Rows of the category table 340 may represent categories. Columns of the category table 340 may include an element ID column that indicates a unique identifier for an element, and a code column that indicates a unique human readable name of the category. Rows of the subcategory table 350 may represent subcategories. Columns of the subcategory table 350 may include a subcategory ID column that indicates a unique identifier for the subcategory, a code column that indicates a unique human readable name of the subcategory, a category ID column that indicates the owning category (referencing a row of the category table 340, such that one or more subcategories may be owned by one category), and appearance columns, such as a color column, a weight column, a style column, etc. that define a symbology used when displaying the element.

Further, rows of a view table 360 may represent graphical views. Columns of the view table 360 may include a viewed models column that indicates models that are displayed (e.g., referencing one or more rows of the model table 320, such that one or more models may be referenced by one or more views), a viewed categories column that indicates categories that are displayed (e.g., referencing one or more rows of the category table 340, such that one or more categories may be referenced by one or more views), and a subcategory override column indicating any overrides to default display status of a subcategory (e.g., by referencing one or more rows of a subcategory override table 370 that indicate how geometry in an applicable subcategory should be displayed).

As discussed above, sometimes it may be desired to incrementally convert data items of a first storage format (e.g., a file-based storage format, such as the DgnV8 format) used in a source repository to a second storage format (e.g., a relational database-based storage format, such as the DgnDb format) used in an output repository. Such incremental conversion may be enabled by the converter 244 building a synchronization information record 278 during conversions, and then consulting the synchronization information record 278 during subsequent conversions to identify data items (e.g., models, elements, levels, etc.) of the source repository 275 that are new or changed and require conversion into data items (e.g., models, elements, categories, subcategories, etc.) of the output repository 273, or are deleted and require removal of corresponding data items from the output repository 273. In general, the synchronization information record 278 may include at least identities of the data items of the source repository as of the last successful conversion, mappings of the data items of the source repository to corresponding data items of the output repository produced from conversion, and state of the data items of the source repository as of the last successful conversion.

Figure 4:
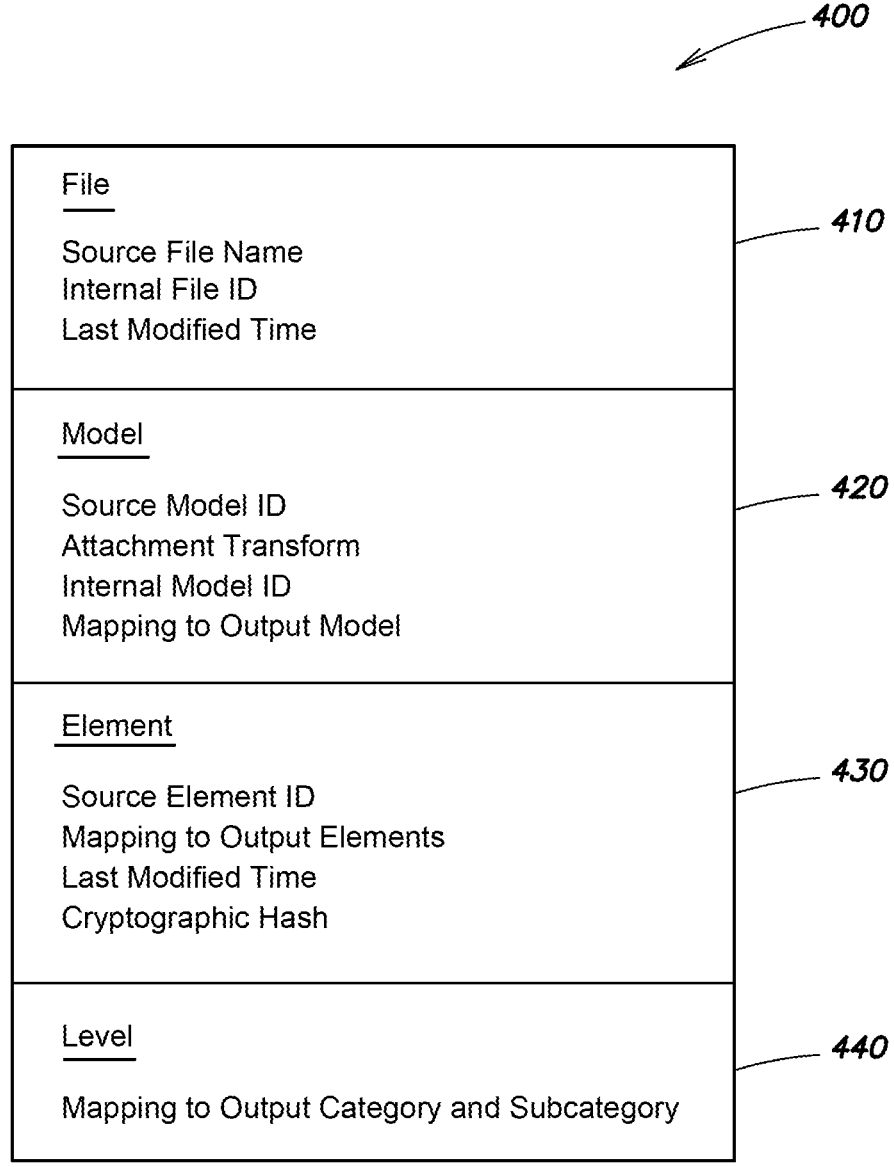
FIG. 4 is an example set of condition information maintained by a synchronization information record that may be used with conversions between a file-based storage format of a source repository and a relational database-based storage format of an output repository.

FIG. 4 is an example set of condition information 400 maintained by a synchronization information record that may be used with conversions between a file-based storage format (e.g., the DgnV8 format) of the source repository 275 and a relational database-based storage format (e.g., the DgnDb format) of the output repository 273. It should be understood that the condition information 400 may vary depending on the exact nature of the storage formats being converted between, and that the specific condition information shown in FIG. 4 is merely representative of types of condition information that may be included in a synchronization information record 278.

The example condition information 400 includes file information 410, such a source filename used in the source repository 275 (e.g., represented as a combination of name and directory), an internal file ID assigned by the converter 244 to uniquely identify the file, and a last modified time (e.g., represented as a last modified time reported by the operating system and a last modified time included in the file's own properties) for each file in the source repository 275 that has been converted.

The example condition information 400 also includes model information 420, such as a source model ID used in a corresponding file of the source repository 275, an attachment transform that indicates a chain of one or more attachments traversed to reach the model in the source repository 275, and an internal model ID assigned by the converter 244 (e.g., a combination of source file ID, source model ID, and the attachment transform) to uniquely identify the model, and a 1:n mapping to models of the output repository 273 (where n is a natural number) for each model in the source repository 275 that has been converted. A model of the source repository 275 may be represented multiple times by model information 420 corresponding to different attachment transforms, each being assigned a different internal model ID. The converter 244 may split a single model of the source repository 275 into multiple models of the output repository 273, or may combine multiple models of the source repository 275 into a single model of the output repository 273, among various possibilities. Such occurrences may be indicated by maintaining multiple pieces of model information 420 for the same internal model ID. Further, since an indication is maintained of both source model ID and a mapping to models of the output repository 273, cases where the source repository 275 and the output repository 273 use differing model IDs can be accommodated.

The example condition information 400 also includes element information 430, such as a source element ID used in the owning model in the source repository 275, a 1:n mapping to elements of the output repository 273 (where n is a natural number), a last modified time, and a cryptographic hash of the element's logical contents, for each element in the source repository 275 that has been converted. By maintaining such information, cases where the source repository 275 and the output repository 273 use differing element IDs can be accommodated. For example, since an indication is maintained of both source element ID and a mapping to elements of the output repository 273, correspondence between the two may be tracked. Further, cryptographic hashes may be relied upon instead of element IDs to identify elements. It should be understood that the inclusion of element IDs may be optional. When a source repository has unstable element IDs that may have changed since a last successful conversion, cryptographic hashes, rather than element IDs, may be used as the primary method of identifying elements.

The example condition information 400 also includes level information 440, such as a mapping to a category and subcategory of the output repository 273 in the source repository 275. A variety of other types of condition information may also be included in the example condition information 400.

Figure 5A:
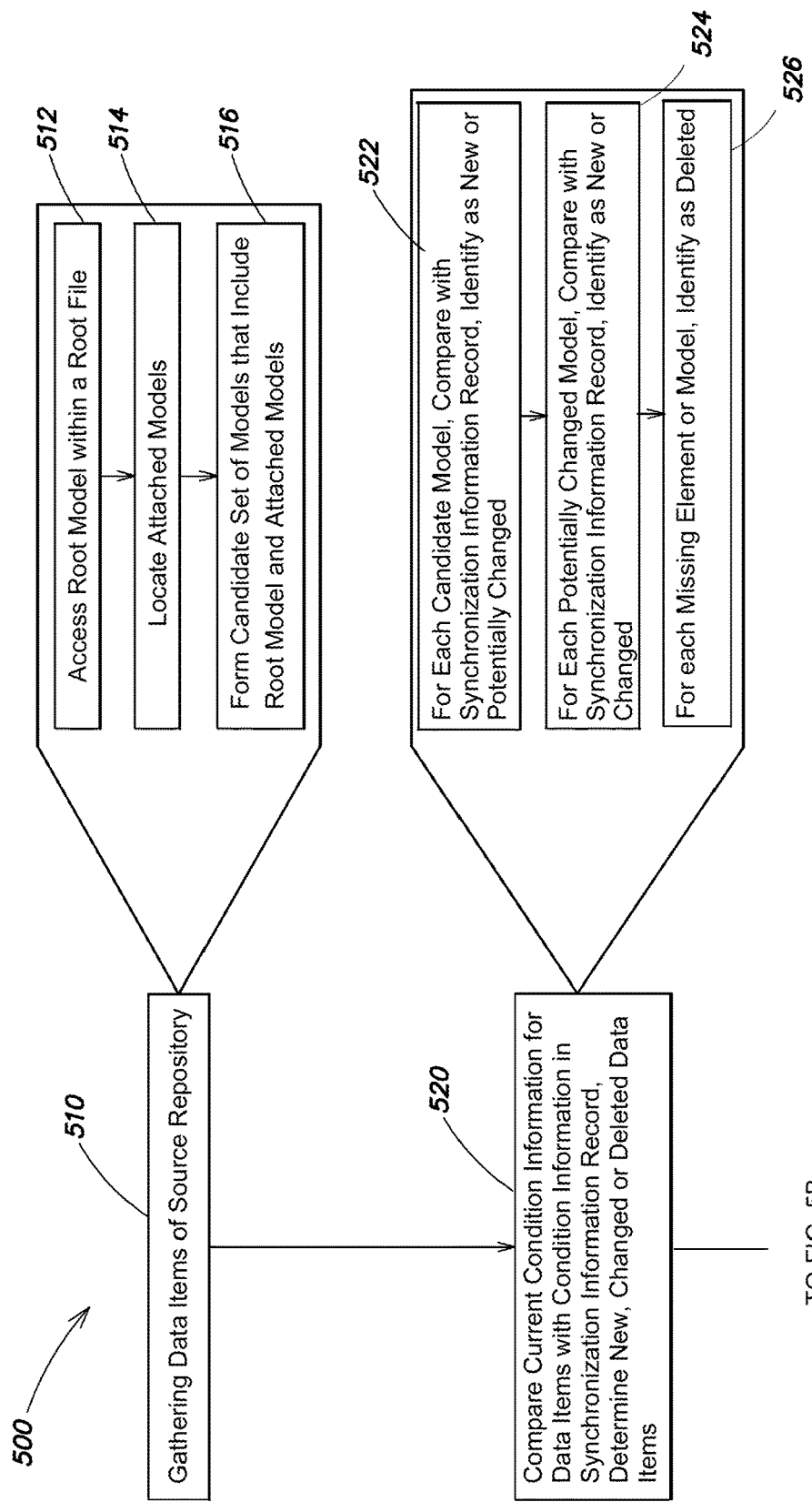
FIGS. 5A and 5B together are a flow diagram of an example sequence of steps for converting a CAD description maintained in a first storage format of a source repository to a second storage format of an output repository.
Figure 5B:
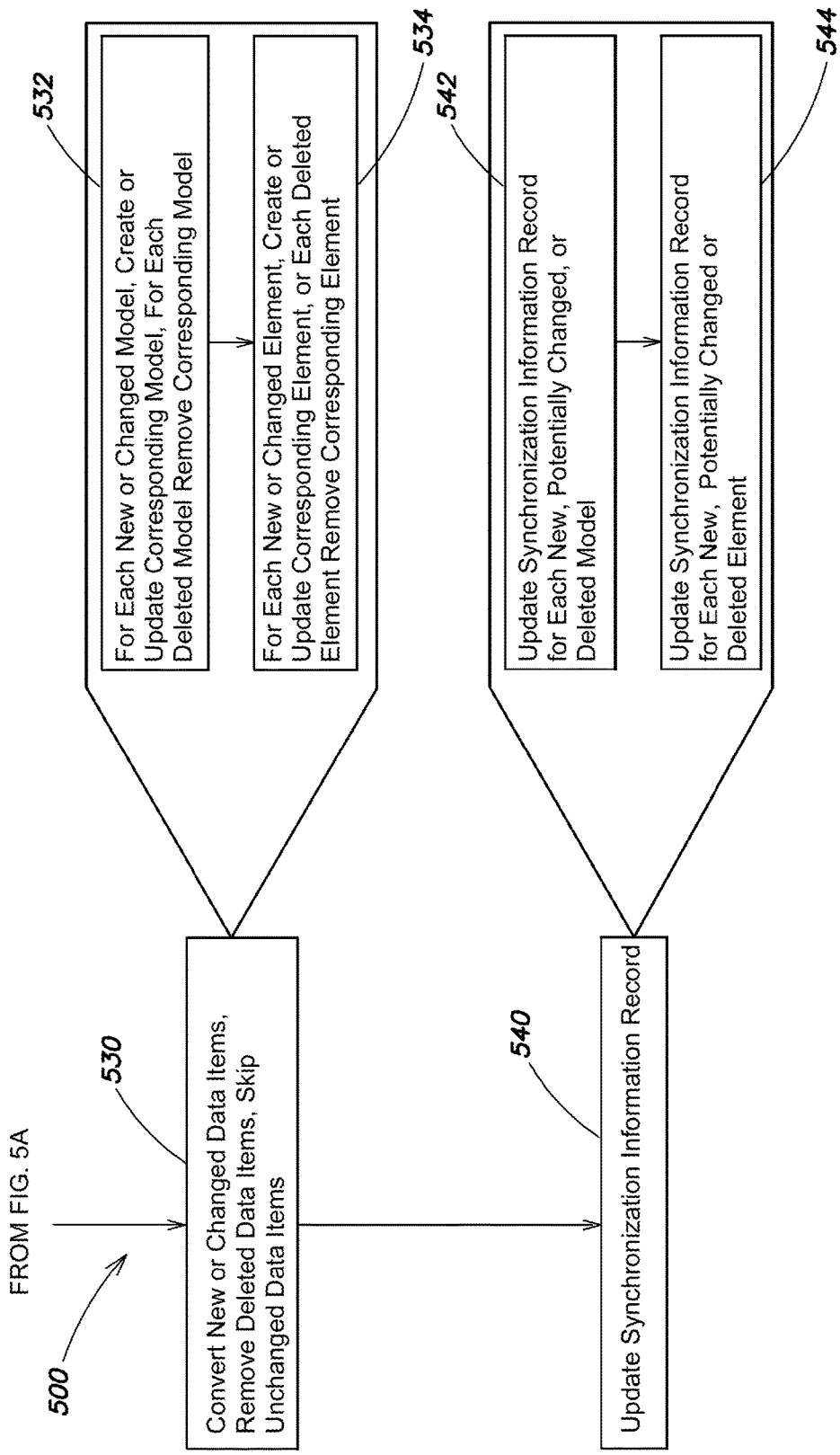

FIGS. 5A and 5B together are a flow diagram of an example sequence of steps 500 for converting a CAD description maintained in a first storage format (e.g., a file-based storage format 100, such as the DgnV8 format) of a source repository 275 to a second storage format (e.g., a relational database-based storage format 300, such as the DgnDb format) of an output repository 273. The steps 510, 520, 530, etc. to the left side of the flow diagram depict generalized operations that may be applicable to a variety of different types of first and second storage formats, while the sub-steps 512, 514, 516, etc. to is the right side of the flow diagram show more specific operations that may be applicable to a case where the source repository 275 is a file-based storage format 100 (e.g., a DgnV8 format) and the second storage format is a relational database-based storage format 300 (e.g., a DgnDb format).

At step 510, the converter 244 gathers data items (e.g., files, models, elements, levels, etc.) of the source repository 275. In a specific implementation of step 510, the converter 244 may, at sub-step 512, access a root model within a root file according to the file-based storage format 100. Then, at sub-step 512, the converter 244 may locate one or more attached models following a model graph from the root model. Each attached model reached by a unique attachment may be treated as a separate copy of the model. Thereafter, at sub-step 514, the converter may form a candidate set of models that includes the root model and the one or more attached models.

At step 520, the converter compares current condition information for data items in the source repository 275 with condition information as of a last successful conversion maintained by the synchronization information record 278, and from this determine one or more new or changed data items in the source repository 275 since the last successful conversion. Further, for any data items present in the synchronization information record 278 but not encountered when the converter 244 gathered data items in prior step 510, the converter 244 concludes such data items have been deleted from the source repository 275. In a specific implementation of step 520, at sub-step 522, for each candidate model in the candidate set of models, the converter 244 may compare current condition information for the model with any corresponding condition information in the synchronization information record 278, and in response to differences, identify the candidate model as a new or potentially changed model. For example, for each candidate model in the candidate set of models, the converter 244 may look up the candidate model in the model information 420 of the synchronization information record 278, if not found, determine the candidate model is a new model. If the candidate model is found, the converter 244 may compare a last modified time of model's file with the last modified time in the file information 410 corresponding to the found model information 420 of the synchronization information record 278. If the times are the same, the converter 244 may skip the model. If the times are different, the converter 244 may determine the candidate model is a potentially changed model.

Further, at sub-step 524, for each potentially changed model, the converter 244 may compare condition information of each element of the potentially changed model with any corresponding condition information in the synchronization information record 278, and in response to differences identify the element as new, changed or deleted. For example, for each element of the potentially changed model, the converter 244 may look up the element in element information 430 of the synchronization information record 278, and if not found, determine the element is a new element. If found, the converter 244 may compare the element's last modified time with the last modified time in the element information 430 of the synchronization information record 278 corresponding to the found element. If the times are different, the converter 244 may consider the element a potentially changed element and compare cryptographic hash of the potentially changed element's logical contents (e.g., a hash of the elements data and data of related attributes that contain application-specific data and/or business data) against a hash maintained in the element information 430 of the synchronization information record 278 corresponding to the found element. If the hashes are the same, the converter 244 may skip the potentially changed element, concluding it has not actually changed. If the cryptographic hashes are different, the converter 244 may conclude the potentially changed element is a changed element.

The above described initial comparison of timestamps may serve to increase performance, by quickly detecting elements that are clearly changed, while the latter comparison of cryptographic hashes for elements that have not been identified as clearly changed more accurately identifies changed elements, covering cases where an element has changed but its timestamp is unchanged (which may occur in some types of content changes or when a timestamp is inaccurate). It should be understood that the initial comparison of timestamps is thereby optional and that, in certain alternative implementations, may not be employed.

Still further, at sub-step 526, the converter compares elements and models for which information is included in the synchronization information record 278 with a list of elements and models encountered when the converter 244 gathered data items from the source repository 275 in prior step 510. When no corresponding element or model in the source repository 275 is found, the element or model is identified as deleted.

At step 530, the converter 244 converts new or changed data items of the source repository 275 into data items of output repository 273, and removes data items from the output repository 273 corresponding to deleted data items of the source repository 275, while skipping unchanged data items, thereby performing an incremental conversion. In a specific implementation of step 530, at sub-step 532, the converter 244 may, for each model that is new or changed, create or update a corresponding model in output repository 273, along with other related data items and attributes, and for each model that is deleted, remove a corresponding model from the output repository 273, along with other data items and attributes that are only related to such model. Likewise, at sub-step 534, the converter 244 may, for each element that is new or changed, create or update a corresponding element in the output repository 273, along with other related data items and attributes, and for each element that is deleted, remove a corresponding element from the output repository 273, along with other data items and attributes that are only related to such element. Sub-step 532 and 534 may involve complex conversions of related data items (e.g., of related levels to categories and subcategories), the details of which are not shown.

At step 540, the converter 244 updates the synchronization information record to include current condition information for data items in the source repository 275. In a specific implementation of step 540, at sub-step 542, the converter 244 updates the synchronization information record 278 to include current condition information for each new or potentially changed model and related data items.

For example, in the case of a changed model, the converter 244 may update the model's mappings and the owning file's timestamps, among other condition information in the synchronization information record 278. At sub-step 544, the converter 244 may update the synchronization information record 278 to include current condition information for each new, changed or deleted element and related data items. For example, in the case of a changed element, the converter 244 may update the element's mappings, last modified time, and cryptographic hash, among other condition information in the synchronization information record 278.

Concluding Comments

The above disclosure details techniques for utilizing a special synchronization information record separate from a source repository to enable incremental storage format conversion even when the source repository has limited capabilities. It should be understood that various adaptations and modifications may be made to the above discussed techniques. While a conversion between DgnV8 and DgnDb is mention above as one possible use of the disclosed techniques, it should be remembered that the techniques are in no way limited to use with this specific conversion, and are applicable to conversions between a wide variety of storage formats, including DgnV7, Dwg, Dxf, Dwf, and Dwfx, among many others.

In general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/ hardware implementations may include both electronic device-executable instructions stored in a non-transitory electronic device-readable medium, as well as one or more hardware components. Above all, it should be understood that the above description is meant to be taken only by way of example.

What is claimed is:

1. A method for incrementally converting data items of a source repository that maintains a computer aided design (CAD) description according to a first storage format to data items of an output repository that maintains the CAD description according to a second storage format, the method comprising:
    gathering, by a converter executing on an electronic device, data items of the source repository that maintains the CAD description according to the first storage format, the data items of the source repository including at least one of models, elements or levels of the CAD description;
    comparing, by the converter, current condition information for data items of the source repository with condition information as of a last successful conversion in a synchronization information record maintained as a relational database separate from the source repository, the condition information of the synchronization information record including at least:
        identities of the data items of the source repository as of the last successful conversion,
        mappings of the data items of the source repository to corresponding data items of the output repository produced from conversion thereof, the data items of the output repository including at least one of models, elements, categories or subcategories of the CAD description, and
        state of the data items of the source repository as of the last successful conversion;
    in response to the comparing, determining one or more new or changed data items in the source repository since the last successful conversion;
    converting, by the converter, the one or more new or changed data items in the source repository to the second storage format of the output repository, while skipping any unchanged data items of the source repository; and
    updating the synchronization information record to include the current condition information for data items in the source repository.

2. The method of claim 1, wherein each data item in the source repository is converted to zero or more corresponding data items in the output repository, and the mappings are 1:n mappings, where n is a natural number.

3. The method of claim 1, wherein the identities of the data items in the source repository are represented, at least in part, by identifiers (IDs), and the IDs of one or more of the data items in the source repository are different than IDs of one or more data items in the output repository produced from conversion thereof, and the mappings relate the IDs used in the source repository to the IDs used in the output repository.

4. The method of claim 1, wherein identities of the data items in the source repository are represented by identifiers (IDs), the IDs of the data items in the source repository are unstable such that at least one ID of a data item in the source repository is changed since the last successful conversion, and identities of the data items in the source repository are represented, at least in part, by a cryptographic hash of contents of the data items.

5. The method of claim 1, wherein the first storage format is a file-based storage format that uses one or more files to maintain the elements organized into the models, associated with the levels that define graphical views, and the second storage format is a relational database-based storage format that uses a database including tables to represent the elements organized into the models and associated with the categories and the subcategories that define graphical views.

6. The method of claim 5, wherein the file-based storage format is a DgnV8 storage format and the relational database-based storage format is a DgnDb storage format.

7. The method of claim 5, wherein the gathering further comprises:
    accessing a root model within a root file;
    locating one or more attached models by following a model graph from the root model; and
    forming a candidate set of models that includes the root model and the one or more attached models.

8. The method of claim 7, wherein the comparing further comprises:
    for each candidate model in the candidate set of models, comparing current condition information for the model with any corresponding condition information for the model in the synchronization information record;
    in response to differences between the current condition information for the model and any corresponding condition information for the model in the synchronization information record, identifying the candidate model as new or potentially changed;
    for each potentially changed model, for each element of the potentially changed model, comparing condition information for the element with any corresponding condition information in the synchronization information record; and in response to differences between the condition information for each element of the potentially changed model and any corresponding condition information in the synchronization information record, identifying the element as new or changed.

9. The method of claim 8, wherein the converting further comprises:
for each new or changed model, creating or updating a corresponding model in the output repository; and
for each new or changed element, creating or updating a corresponding element in the output repository.

10. The method of claim 9, wherein the updating further comprises:
updating the synchronization information record to include current condition information for each new or potentially changed model and related data items; and
updating the synchronization information record to include current condition information for each new or changed element and related data items.

11. A method for maintaining a record of incremental conversions of data items of a source repository that maintains a computer aided design (CAD) description according to a first storage format to data items of an output repository that maintains the CAD description according to a second storage format, the method comprising:
comparing, by a converter executing on an electronic device, current condition information for data items of the source repository that maintains the CAD description according to the first storage format with condition information as of a last successful conversion in a synchronization information record maintained as a relational database separate from the source repository, the condition information of the synchronization information record including at least
identities of the data items of the source repository as of the last successful conversion,
mappings of the data items of the source repository to corresponding data items of the output repository produced from conversion thereof, and
state of the data items of the source repository as of the last successful conversion;
in response to the comparing, determining, by the converter, one or more new or changed data items in the source repository since the last successful conversion; and
updating the synchronization information record to include the current condition information for data items in the source repository.

12. The method of claim 11, wherein each data items in the source repository is converted to zero or more corresponding data items in the output repository, and the mappings are 1:n mappings, where n is a natural number.

13. The method of claim 11, wherein the identities of the data items in the source repository are represented, at least in part, by identifiers (IDs), and the IDs of one or more of the data items in the source repository are different than IDs of one or more data items in the output repository produced from conversion thereof, and the mappings relate the IDs used in the source repository to the IDs used in the output repository.

14. The method of claim 11, wherein identities of the data items in the source repository are represented by identifiers (IDs), the IDs of the data items in the source repository are unstable such that at least one ID of a data item in the source repository is changed since the last successful conversion, and identities of the data items in the source repository are represented, at least in part, by a cryptographic hash of contents of the data items.

15. A non-transitory electronic device-readable medium containing executable instructions to incrementally convert data items of a first storage format used to maintain a computer aided design (CAD) description to data items of a second storage format used to maintain the CAD description, the executable instructions, when executed by one or more processors of an electronic device operable to:
gather data items of the first storage format, the data items of the first storage format including at least one of models, elements or levels of the CAD description;
compare current condition information for data items of the first storage format with condition information as of a last successful conversion in a synchronization information record;
determine one or more new or changed data items of the first storage format since the last successful conversion;
convert the one or more new or changed data items of the first storage format to the second storage format, while skipping any unchanged data items of the first storage format, the data items of the second storage format including at least one of models, elements, categories or subcategories of the CAD description; and
update the synchronization information record to include the current condition information for data items in the first storage format,
wherein identifiers (IDs) of one or more of the data items in the first storage format are different than IDs of one or more data items of the second storage format produced from conversion thereof, or the IDs of one or more of the data items of the first storage are unstable IDs such that at least one ID of a data item of the first storage format is changed since the last successful conversion, and the synchronization information record tracks the different or unstable IDs.

16. The non-transitory electronic device-readable medium of claim 15, wherein each data item of the first storage format is converted to zero or more corresponding data items of the second storage format according to 1:n mappings, where n is a natural number, and the synchronization information record tracks the mapping.

17. The non-transitory electronic device-readable medium of claim 15, wherein executable instructions to gather data items, when executed by the one or more processors of the electronic device, are further operable to:
access a root model within a root file;
locate one or more attached models by following a model graph from the root model; and
form a candidate set of models that includes the root model and the one or more attached models.

18. The non-transitory electronic device-readable medium of claim 17, wherein executable instructions to compare current condition information, when executed by the one or more processors of the electronic device, are further operable to:
for each candidate model in the candidate set, compare current condition information for the model with any corresponding condition information for the model in the synchronization information record;
in response to differences between the current condition information for the model and any corresponding condition information for the model in the synchronization information record, identify the candidate model as new or potentially changed;

for each potentially changed model, for each element of the potentially changed model, compare condition information for the element with any corresponding condition information in the synchronization information record; and in response to differences between the condition information for each element of the potentially changed model and any corresponding condition information in the synchronization information record, identify the element as new or changed and the potentially changed model as changed.

19. The non-transitory electronic device-readable medium of claim 18, wherein executable instructions to convert new or changed data items, when executed by the one or more processors of the electronic device, are further operable to:

for each new or changed model, convert the new or changed model to the second storage format; and for each new or changed element, convert the new or changed element and any related data to the second storage format.

20. The non-transitory electronic device-readable medium of claim 18, wherein executable instructions to convert new or changed data items, when executed by the one or more processors of the electronic device, are further operable to:

update the synchronization information record to include current condition information for each new or potentially changed model; and update the synchronization information record to include current condition information for each new or changed element and related data.

* * * * *